United States Patent
Leskelä et al.

(10) Patent No.: US 7,108,747 B1
(45) Date of Patent: Sep. 19, 2006

(54) METHOD FOR GROWING OXIDE THIN FILMS CONTAINING BARIUM AND STRONTIUM

(75) Inventors: Markku Leskelä, Espoo (FI); Mikko Ritala, Espoo (FI); Timo Hatanpää, Espoo (FI); Timo Hänninen, Helsinki (FI); Marko Vehkamäki, Helsinki (FI)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/787,062

(22) PCT Filed: Sep. 13, 1999

(86) PCT No.: PCT/FI99/00741

§ 371 (c)(1),
(2), (4) Date: Jun. 28, 2001

(87) PCT Pub. No.: WO00/15865

PCT Pub. Date: Mar. 23, 2000

(30) Foreign Application Priority Data

Sep. 11, 1998 (FI) ...................................... 981959

(51) Int. Cl.
*C30B 25/02* (2006.01)
(52) U.S. Cl. ............................. 117/88; 117/89; 117/104
(58) Field of Classification Search ................. 117/88, 117/89, 104
See application file for complete search history.

(56) References Cited

U.S. PATENT DOCUMENTS

| | | | |
|---|---|---|---|
| 4,058,430 A | 11/1977 | Suntola et al. | |
| 4,927,670 A | 5/1990 | Erbil | |
| 5,225,561 A | 7/1993 | Kirlin et al. | 546/256 |
| 5,439,876 A * | 8/1995 | Graf et al. | 505/447 |
| 5,453,494 A * | 9/1995 | Kirlin et al. | 534/15 |
| 5,472,927 A * | 12/1995 | Mulder et al. | 502/439 |
| 5,496,582 A | 3/1996 | Mizutani et al. | 427/66 |
| 5,617,290 A | 4/1997 | Kulwicki et al. | |
| 5,972,430 A * | 10/1999 | DiMeo, Jr. et al. | 427/255.32 |
| 6,020,024 A * | 2/2000 | Maiti et al. | 427/248.1 |
| 6,087,257 A | 7/2000 | Park et al. | |
| 6,099,904 A | 8/2000 | Mak et al. | |
| 6,144,060 A * | 11/2000 | Park et al. | 257/310 |
| 6,380,579 B1 * | 4/2002 | Nam et al. | 257/306 |
| 6,420,230 B1 * | 7/2002 | Derderian et al. | 438/255 |
| 6,444,592 B1 * | 9/2002 | Ballantine et al. | 438/770 |
| 6,583,057 B1 | 6/2003 | Alluri et al. | |
| 6,800,567 B1 | 10/2004 | Cho | |

FOREIGN PATENT DOCUMENTS

| | | |
|---|---|---|
| EP | A1 0 344 352 | 12/1989 |
| FR | A1 2 626 110 | 7/1989 |
| WO | PCT/FI 99/00741 | 12/1999 |

OTHER PUBLICATIONS

Materials Science and Engineering, vol. B41, 1996, Lauri Niinisto et al, "Synthesis of oxide thin films and overlayers by atomica layer epitaxy for advanced applications" p. 23-29.

(Continued)

*Primary Examiner*—Robert Kunemund
(74) *Attorney, Agent, or Firm*—Knobbe Martens Olson & Bear LLP (57) ABSTRACT

The present invention relates to a method for growing oxide thin films which contain barium and/or strontium. According to the method, such thin films are made by the ALE technique by using as precursors for barium and strontium their cyclopentadienyl compounds. A thin film made by means of the invention has a high permittivity and excellent conformality.

39 Claims, 3 Drawing Sheets

OTHER PUBLICATIONS

Bilodeau et al., "MOCVD BaSrTiO$_3$ for ≧1-Gbit DRAMs," *Solid State Technology*, pp. 235-242 (Jul. 1997).

Kang et al., "Deposition Characteristics of (Ba, Sr) TiO$_3$ Thin Films by Liquid Source Metal-Organic Chemical Vapor Deposition at Low Substrate Temperatures," *Jpn. J. Appl. Phys.*, vol. 36, pp. 6946-6952 (1997).

Kiyotoshi et al., "Chemical Vapor Deposition of High Quality (Ba, Sr)TiO$_3$ Thin Films Using Individual Vaporizing Liquid Source Supply System," *Electrochemical Society Proceedings*, vol. 97-25, pp. 1063-1070 (1997).

Martenson et al., "Halide chemical vapour deposition of Bi$_2$Sr$_2$CaCu$_2$O$_{8+x}$: aspects of epitaxy," *Journal of Crystal Growth*, vol. 156, pp. 67-73 (1995).

Niinistö et al., "Synthesis of oxide thin films and overlayers by atomic layer epitaxy for advanced applications," *Materials Science & Engineering*, vol. B41, pp. 23-29, (1996).

Ritala et al., "Growth of titanium dioxide thin films by atomic layer epitaxy," *Thin Solid Films*, vol. 225, pp. 288-295 (1993).

Ritala et al., "Titanium Isopropoxide as a Precursor in Atomic Layer Epitaxy of Titanium Dioxide Thin Films," *Chem. Mater.*, vol. 5, pp. 1174-1181 (1993).

Ritala et al., "Atomic Epitaxy Growth of Titanium Dioxide Thin films from Titanium Ethoxide," *Chem. Mater.*, vol. 6, pp. 556-561 (1994).

Schulz et al., "MOCVD Routes to Thin Metal Oxide Films for Superconducting Electronics," *Adv. Mater.*, vol. 6, No. 10, pp. 719-730 (1994).

Sheppard, "Advances in Processing of Ferroelectric Thin Films," *Ceramic Bulletin*, vol. 71, No. 1, (1992).

*Advances in Organometallic Chemistry*, Ed. Stone and West, vol. 40, Academic Press (1996).

Suntola, "Atomic layer epitaxy," *Thin Solid Films*, vol. 216, pp. 84-89 (1992).

Wojtczak et al., "A Review of Group 2 (Ca, Sr, Ba) Metal-Organic Compounds as Precursors for Chemical Vapor Deposition," *Advances in Organometallic Chemistry*, vol. 40, pp. 215-340 Academic Press (1996).

Vehkamäki et al., *Growth of SrTiO$_3$ and BaTiO$_3$ Thin Films by Atomic Layer Deposition*, Electrochemical and Solid-State Letters, 2 (10) pp. 504-506 (1999).

Nakano et al., *Digital chemical vapor deposition of SiO$_2$*, Appl. Phys. Lett 57 (11), Sep. 10, 1990, pp. 1096-1098.

S.M. Bedair, *Atomic layer epitaxy deposition processes*, J. Vac. Sci Technol. B 12(1), Jan./Feb. 1994, pp. 179-185.

* cited by examiner

METHOD FOR GROWING OXIDE THIN FILMS CONTAINING BARIUM AND STRONTIUM

This is the U.S. national phase under 35 U.S.C. § 371 of International Application PCT/FI99/00741, filed Sep. 13, 1999.

The present invention relates to high permittivity oxide films and superconductive materials which contain barium and/or strontium. A particular object of the invention is the method according to the preamble of claim 1 for producing such films and materials.

Dielectric thin films having high dielectric constants (permittivities) are required in many sub-areas of microelectronics and optoelectronics. In particular, the continual decrease in the size of microelectronics components has increased the need for the use of such dielectric films. For example, the capacitance of DRAM (Dynamic Random Access Memory) capacitors must remain nearly constant while their size decreases rapidly, and thus it is necessary to replace the previously used $SiO_2$ and $Si_3N_4$ with materials which have higher permittivities than these. In optoelectronics, dielectric films having high permittivities can be exploited in, for example, electroluminence displays, in which the operating voltage of the displays can be reduced by means thereof. Some dielectric materials having high permittivities, e.g. $BaTiO_3$, are also ferroelectric materials at normal temperatures, a factor which further extends their potential uses, for example, to NVRAM (Nonvolatile Random Access Memory) and various microelectromechanical applications.

In addition to high permittivities, these dielectric thin films are required to have, among other things, low leakage current densities and high dielectric breakdown fields. The achievement of both of these properties presupposes a dense and flawless film structure. Of course, the properties of the films must be stable in the conditions of use. Furthermore, in particular in microelectronics applications, the conformality of the films, i.e. their capacity to cover surfaces of complicated shapes with a film of a uniform thickness is important, because in the manufacture of microelectronics components it is necessary to deposit films even in deep trenches and holes.

Oxide thin films containing barium and strontium are widely used and researched dielectric films having high permittivities. Important oxide thin films containing barium and strontium include, for example, $BaTiO_3$, $SrTiO_3$ and $Ba_{1-x}Sr_xTiO_3$ (x is 0–1). In addition to these there can be mentioned high-temperature superconductors, e.g. $YBa_2Cu_3O_{7-x}$ (x is 0–1), $Bi_2Sr_2Ca_{n-1}Cu_nO_{5+(2n-1)+\delta}$ and $Tl_2Ba_2Ca_{n-1}Cu_nO_{5+(2n-1)+\delta}$, and dielectric materials lattice-matched therewith, $PrBa_2Cu_3O_{7-\delta}$ and $Sr_2AlTaO_6$ (D. L. Schulz and T. J. Marks, Advanced Materials 6 (1994) 719). In all of the above-mentioned formulae, n is 1–3 and δ is 0–1. Other oxide films containing barium and strontium include various niobates $(Sr,Ba)Nb_2O_6$ and $(Pb,Ba)Nb_2O_6$ (L. M. Shepard, Ceramic Bulletin 71 (1992) 85). These films have been manufactured by many different methods, such as the sol-gel method, various physical vapor deposition methods (PVD) (e.g. vaporization, sputtering, laser ablation) and chemical vapor deposition methods (CVD).

Films manufactured by the sol-gel method, by various physical vapor deposition methods (PVD) (e.g. vaporization, sputtering, laser ablation) and by chemical vapor deposition methods (CVD) are of a high quality. Instead, the manufacture of a film of uniform quality and thickness when the surface structure of the piece is complicated will not succeed. Only by the CVD method is it possible to deposit conformal films in deep trenches and holes (S. M. Bilodeau, Solid State Technology, July (1997) 235). Even in the CVD method, high conformality is attained only when the rate of film growth is determined by the rate of the surface reaction and not by the diffusion of the precursors on the film surface. This is achieved when the surface reaction is slower than the diffusion of the precursors on the film surface. The surface reaction is slow at low temperatures, but in such a case the other properties of the film will, however, often remain poor, which is due to both the poor crystallinity of the film and to difficulties in the control of its composition (C. S. Kang et al., Japanese Journal of Applied Physics, Part 1 36 (1997) 6946; M. Kiyotoshi and K. Eguchi, Electrochemical Society Proceedings 97–25 (1997) 1063).

Atomic Layer Epitaxy (ALE), which is also known as Atomic Layer Chemical Vapor Deposition (ALCVD) or Atomic Layer Deposition (ALD), is a known method for the deposition of thin films (U.S. Pat. No. 4,085,430). In this method, the thin film is deposited by means of alternate saturating surface reactions. These reactions are implemented by feeding gaseous or vaporized precursors into the reactor alternately and by purging the reactor with an inert gas between the precursor pulses (T. Suntola, Thin Solid Films 215 (1992) 84; Niinistö et al., Materials Science and Engineering B 41 (1996) 23). In addition, ALE can be used for depositing layers of uniform thickness even on large surfaces, and the control of the thickness and composition by means of the number of reaction cycles is precise and simple.

The ALE method has previously been used for making $TiO_2$ films (Ritala et al., Thin Solid Films 225 (1993) 288, Chemistry of Materials 5 (1993) 1174 and 6 (1994) 556), but so far it has not been possible to manufacture the barium- and strontium-containing oxide thin films which are the object of the present invention by the ALE method in a self-controlling manner. Attempts at self-controlling deposition of superconductive films have also failed. The most important reason for not manufacturing the above-mentioned compounds is the lack of suitable precursors for Ba and Sr. Few of the compounds of the said elements are volatile, and so the precursors used in both CVD and ALE have as a rule been of one compound type, i.e. β-diketonates (W. A. Wojtcak et al., Advances in Organometallic Chemistry 40 (1996) 215, Tiitta and Niinistö, Chemical Vapor Deposition 3 (1997) 167). The problem with the β-diketonates of Ba and Sr is that they do not react with the oxygen sources, $H_2O$, $H_2O_2$ and $O_2$, most typically used in the ALE method, at temperatures at which they would not decompose thermally. Iodides of the said metals have also been used in the CVD method (P. Mårtensson and A. Hårsta, Journal of Crystal Growth 156 (1995) 67), but in this case it is necessary to use temperatures which are too high for most applications.

EP application publication No. 344 352 describes a method for making laminated superconductors by an epitaxy method. The ALE method is also mentioned. The application publication also lists suitable organometallic compounds which can be used as precursors in these methods. Barium cyclopentadienyl is also among them. However, in the publication a film has not been deposited by specifically the ALE method and by using specifically barium cyclopentadienyl as the precursor. Furthermore, the EP publication does not provide preferred conditions for the film growth, since it does not state how or in what conditions cyclopentadienyl compounds should be used, how oxygen is introduced into the oxides or what advantages would follow specifically from the use of barium cyclopentadienyl as the precursor in any of the alternative epitaxy methods described in the publication.

It is an object of the present invention to eliminate the deficiencies described above and to provide a novel method for the manufacture of thin films and superconductive materials which contain barium and strontium.

The invention is based on the observation that the barium and strontium compounds according to the invention are sufficiently stable in a gas phase, and consequently these compounds can be used as precursors in the ALE technique, and thus oxide thin films which contain barium and strontium can be deposited in a controlled manner. The cyclopentadienyl compounds of barium and strontium are such vaporizable compounds. In the deposition of film, the said barium and strontium compounds are used as precursors in a method according to the ALE principle together with a reactive oxygen precursor and a volatile titanium compound.

More specifically, the method according to the invention is characterized by what is stated in the characterizing part of claim 1.

The invention will be discussed below with the help of the accompanying drawings.

In the technical solution according to the invention, oxide thin films are deposited in an ALE reactor at a temperature of 100–700° C., preferably 150–400° C. Either sheet-form (such as glass or silicon wafer) or pulverous materials can be used as the substrate. According to the ALE method, a cyclopentadienyl compound containing an earth-alkali metal is vaporized, whereafter the reactor is purged with an inert gas, the oxygen precursor is fed into the reactor, and the reactor is purged for a second time with an inert gas. All of these steps together constitute one deposition cycle. The deposition cycle is repeated until the film is of the desired thickness. A multi-component film is obtained by changing the precursor.

In connection with the present invention, cyclopentadienyl compounds of barium or strontium are used as precursors. By these compounds is meant any compound according to Formulae I–IV.

| | |
|---|---|
| M(Cp)$_2$ | (I) |
| M(Cp)$_2$L$_n$ | (II) |
| M(Cp)X | (III) |
| M(Cp)XL$_n$, | (IV) | in which formulae

M is Ba or Sr;

Cp is a cyclopentadienyl group, the Cp groups present in Formulae I and II being mutually the same or different;

X is a ligand other than Cp, with the valency of −1;

L$_n$ is a neutral adduct ligand which binds to a metal by either one or several of its atoms, and n depicts the number of the ligands being bound.

In Formulae I–IV the cyclopentadienyl groups may also be in the same molecule. In this case the bridge between two Cp groups is made up of a substituted or unsubstituted C$_1$–C$_6$ chain, which may contain a heteroatom which is Si, N, P, Se or S.

Ligand X is preferably β-diketonate or a corresponding sulfur or nitrogen compound, halide, amide, alkoxide, carboxylate or Schiff base.

L is preferably
(i) a hydrocarbon,
(ii) an oxygen-containing hydrocarbon,
(iii) a nitrogen-containing hydrocarbon,
(iv) a sulfur-containing hydrocarbon,
(v) a phosphorus-containing hydrocarbon,
(vi) an arsenic-containing hydrocarbon,
(vii) a selenium-containing hydrocarbon, and/or
(viii) a tellurium-containing hydrocarbon.

Most preferably L is
(a) an amine or a polyamine,
(b) a bipyridine,
(c) a ligand depicted by the formula (V)

in which formula G is —O—, —S—, or —NR$^1$—, where R$^1$ is hydrogen or a substituted or unsubstituted, cyclic, linear or branched alkyl, alkenyl, aryl, alkylaryl, arylalkyl, alkoxy, thio, cyano or silyl group. The cyclic or aromatic ring of R$^1$ may contain a heteroatom. The ligand depicted by Formula V may also have either hydrogen or a substituent like R$^1$ attached to the carbon atoms, (d) ether or thioether.

The cyclopentadienyl group (Cp) in Formulae I–IV is of the form

Cp'R$_m$H$_{5-m}$ (VI), where m is an integer of 0–5,

Cp' is a fused or individual cyclopentadienyl, and

R is a hydrocarbon radical containing 1–20 carbon atoms, preferably a C$_1$–C$_6$ hydrocarbon. The R's may be mutually the same or different. R may be a substituted or unsubstituted, cyclic, linear or branched alkyl, alkenyl, aryl, alkylaryl, arylalkyl, alkoxy, thio, amino, cyano or silyl group. The cyclic or aromatic ring of the substituent may contain a heteroatom. Methyl, ethyl, propyl and isopropyl groups can be mentioned as examples of the substituents.

Preferably there is used an organometallic complex according to Formula II, where Cp is cyclopentadienyl, indenyl or fluorenyl. As the neutral adduct ligand L (Formulae II and IV) there are used, for example, ethers, amines or solvent molecules (e.g. tetrahydrofuran) which bind to the metal by one atom. Polyethers and polyamines can be mentioned as examples of suitable ligands which bind to the metal by several of their atoms.

According to the invention, the precursor used for the oxide thin film is especially preferably a THF adduct of bis(pentamethylcyclopentadienyl) or bis(triisopropylcyclopentadienyl) of barium or strontium.

According to the first preferred embodiment of the invention, the cyclopentadienyl compounds of barium and strontium are used together with a volatile titanium compound (e.g. a halide, alkoxide, cyclopentadienyl, alkylamide) and a reactive oxygen precursor (e.g. H$_2$O, H$_2$O$_2$), in which case BaTiO$_3$, SrTiO$_3$ and Ba$_{1-x}$SR$_x$TiO$_3$ films can be grown by the ALE method at low deposition temperatures (325° C.). The said precursors can also be exploited in ALE deposition of other oxide thin films containing barium and/or strontium.

Below there are listed titanium compounds which have vapor pressures sufficient at a temperature lower than the temperature of the deposition substrate, and which are thus suitable for use in the method according to the present invention. Thus, preferably one or more of the following compounds are used as the volatile titanium compound:

titanium halides, for example TiCl$_4$, TiCl$_3$, TiBr$_3$, TiI$_4$, TiI$_3$, titanium alkoxides, for example Ti(OC$_2$H$_5$)$_4$, Ti(O$^i$Pr)$_4$, Ti(O$^n$Bu)$_4$ and titanium (IV)-ethylhexoxide, titanium nitrate (Ti(NO$_3$)$_4$), alkylamino complexes of titanium, for example tetrakis(diethylamino)titanium, tetrakis(dimethylamino)titanium, tetrakis(ethylmethylamino)titanium, tetrakis(isopropylmethylamino)titanium, bis(cyclopentadienyl)bis(dimethylamino)titanium, tris(dimethylamino)(N,N,N'-trimethylethyldiamino)titanium, and tert-butyltris(dimethylamino)titanium; further examples of applicable compounds are described in U.S. Pat. No. 5,659,057, cyclopentadienyl complexes of titanium, for example Ti($\eta^5$-C$_5$H$_5$)$_2$, Ti($\eta^5$-C$_5$H$_5$)($\eta^7$-C$_7$H$_7$), ($\eta^5$-C$_5$H$_5$)TiR$_2$, where R=alkyl (e.g. CH$_3$), benzyl (C$_6$H$_5$) or carbonyl, bis(t-butylcyclopentadienyl)titanium dichloride, bis(pentamethyl-cyclopentadienyl)titanium dichloride, and (C$_5$H$_5$)$_2$Ti(CO)$_2$, silylamido complexes of titanium, such as Ti{N$_4$[Si(CH$_3$)$_3$]$_4$[Si(CH$_3$)$_2$]$_2$}; further examples of applicable compounds are described in U.S. Pat. No. 5,603,988, titaniumdialkyldithiocarbamates, and titanium-β-diketonates, for example di(i-propoxide)bis(2,2,6,6-tetramethyl-3,5-heptanedionato)titanium, and tris(2,2,6,6,-tetramethyl-3,5-heptanedionato)-titanium (III).

Especially preferably, titanium tetraisopropoxide (Ti (O$^i$C$_3$H$_7$)$_4$) is used.

The oxygen precursor may be any oxygen compound usable in the ALE technique. Preferable oxygen precursors include water, oxygen and hydrogen peroxide, and aqueous solutions of hydrogen peroxide. Ozone (O$_3$) is an especially preferable oxygen precursor. It is known on the basis of the literature that, if ozone is used as the precursor for oxygen, a denser layer of material is obtained from the forming oxides, and thereby the permittivity of the oxide thin film can be improved.

One or more of the following compounds may also be used as the precursor for oxygen:

oxides of nitrogen, such as N$_2$O, NO, and NO$_2$, halide-oxygen compounds, for example chlorine dioxide (ClO$_2$) and perchloric acid (HClO$_4$), the compatibility of these with earth-alkali metals being, however, limited, peracids (—O—O—H), for example perbenzoic acid (C$_6$H$_5$COOOH) and peracetic acid (CH$_3$COOOH), alcohols, such as methanol (CH$_3$OH) and ethanol (CH$_3$CH$_2$OH), and various radicals, for example oxygen radical (O..) and hydroxyl radical (.OH).

According to a second preferred embodiment, the ratio of the deposition cycles (e.g. Ti—O, Sr—O and Ba—O) producing the different binary oxides of multicomponent oxide films (e.g. BaTiO$_3$, SrTiO$_3$ and Ba$_{1-x}$Sr$_x$TiO$_3$) is controlled. If, for example, Sr/Ti is 0.8–1.2, preferably approx. 1, a crystalline film is obtained (cf. Example 1). Thus the composition can be controlled simply and with precision. In order that the composition of the film should be uniform, the deposition cycles are carried out so that the different materials become mixed as completely as possible, i.e. there will be 1–10, preferably 1–2 similar cycles in succession.

According to a third preferred embodiment, the oxide film is grown at a lower temperature (250–300° C.), whereby an amorphous thin film is obtained. The structure of the film becomes crystalline during postannealing. The postannealing is carried out at a temperature higher than the growth temperature, and its duration may vary. According to a preferred embodiment of the invention, the duration of the postannealing is 60 min, and it is carried out in an air stream at 500° C.

Considerable advantages are gained with the help of the invention. Since according to the ALE method the film grows through saturating surface reactions, the growth is self-controlling, which in turn ensures excellent conformality. As is evident from the above, cyclopentadienyl compounds of strontium and barium can be used as vaporizing components within a wide temperature range, in which case the structure of the thin film made and its crystallinity can be effectively controlled by the selection of the reaction temperature and the metal mixing ratio and by a potential post-treatment. The present precursors are especially advantageous for use in the ALE technique also for the reason that they will not leave significant carbon or hydrogen residues in the final product. On the other hand, the dielectric constants of oxide thin films containing barium and strontium are very high, and thus the oxides of specifically barium and strontium are especially suitable as materials for dielectric thin films. Owing to their high dielectric constants they are especially suitable for memory circuits and for gate oxides. By the use of cyclopentadienyl compounds of barium together with a volatile titanium compound, a low-temperature growth process is achieved, which is important in most applications of dielectric films.

In the context of the present invention, by dielectric oxide thin film is meant a thin film having a high permittivity. The permittivity varies according to the thickness of the film so that the permittivity of a thinner film is lower. It can be noted as an example that for a film approx. 50 nm thick a high permittivity is approx. 50 or more, preferably approx. 100 or more.

Thin films according to the invention are preferably used as dielectric films of various electronics components. Films according to the invention are deposited, for example, on platinum (Pt), RuO$_2$, IrO$_2$, SrRuO$_3$, LaSrCoO$_3$, IrO$_2$/Ir, RuO$_2$/Pt, silica (SiO$_2$), silicon nitride and silicon surfaces.

By means of the present invention it is possible to make, in addition to the above-mentioned thin films, also high-temperature superconductors mentioned in the preamble, for example YBa$_2$Cu$_3$O$_{7-x}$ (x is 0–1), Bi$_2$Sr$_2$Ca$_{n-1}$Cu$_n$O$_{5+(2n-1)+\delta}$ and Tl$_2$Ba$_2$Ca$_{n-1}$Cu$_n$O$_{5+(2n-1)+\delta}$, and dielectric materials lattice-matched therewith, such as PrBa$_2$Cu$_3$O$_{7-\delta}$, and SR$_2$AlTaO$_6$ (D. L. Schulz and T. J. Marks, Advanced Materials 6 (1994) 719).

Three examples are presented below in order to illustrate the invention.

EXAMPLE 1

SrTiO$_3$ films were grown in a flow-type F-120 ALE reactor (Mikrokemia Oy) at a temperature of 325° C. The strontium precursor used was the THF adduct of bis(triisopropylcyclopentadienyl) strontium, $Sr(C_5(^iC_3H_7)_3H_2)$ $THFG_p$, in which p=0–2 and THF is tetrahydrofuran, and which was vaporized in the reactor by heating it to a temperature of 100° C. The titanium precursor used was titanium tetraisopropoxide $(Ti(O^iC_3H_7)_4)$, which was vaporized in the reactor at a temperature of 40° C. The oxygen source used was water, which was fed into the reactor from outside it. The growth of $TiO_2$ from the said precursors has been described previously (Ritala et al., Chemistry of Materials 5 (1993) 1174).

The growth of $SrTiO_3$ was implemented by using alternate Ti—O and Sr—O deposition cycles. The Ti—O cycle was made up of four steps: (i) an 0.6 s pulse of $Ti(O^iC_3H_7)_4$, an 0.5 s purge with inert nitrogen gas, (iii) an 0.6 s pulse of $H_2O$, and (iv) an 0.5 s purge with nitrogen gas. Respectively, the composition of the Sr—O cycle was: (i) an 0.6 s pulse of $Sr(C_5(^iC_3H_7)HTF_p$, (ii) an 0.5 s purge with nitrogen gas, (iii) an 0.5 s pulse of $H_2O$, and (iv) an 0.5 s purge with nitrogen gas. The composition of the film was controlled by the ratio of the Ti—O and Sr—O cycles. The alternation of the Ti—O and Sr—O cycles was implemented so that there were at maximum two similar cycles in succession. For example, the cycle ratio Ti—O/Sr—O=1:1 was achieved by repeating the cycling formula q[(Ti—O)(Sr—O)] and the ratio Ti—O/Sr—O=3:4 by means of the formula q[(Ti—O)(Sr—O)(Ti—O)(Sr—O)(Ti—O)(Sr—O)(Sr—O)], in which formulae q indicates how many times the said cycling was repeated. Thus q determines the thickness of the film.

Figure 1:
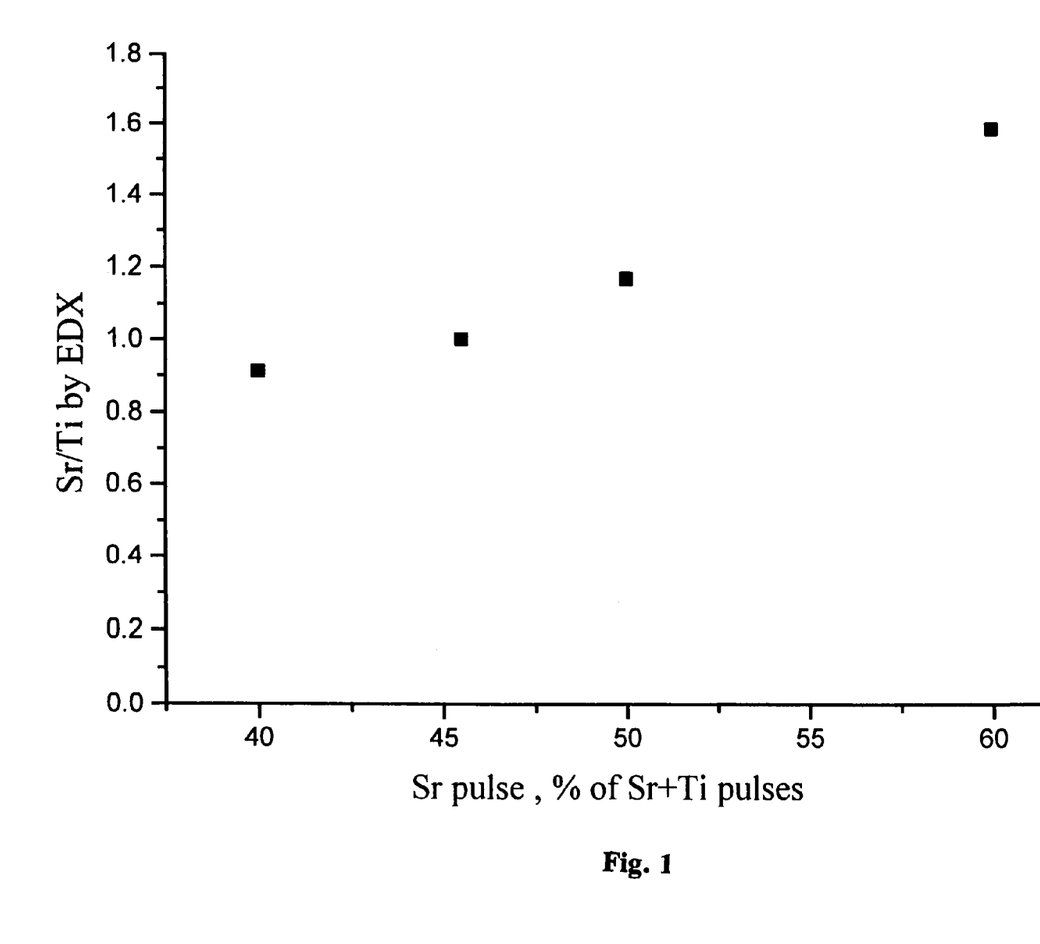
FIG. 1 depicts the composition of a multi-component film as a function of the cycle ratio of the various components.
Figure 2:
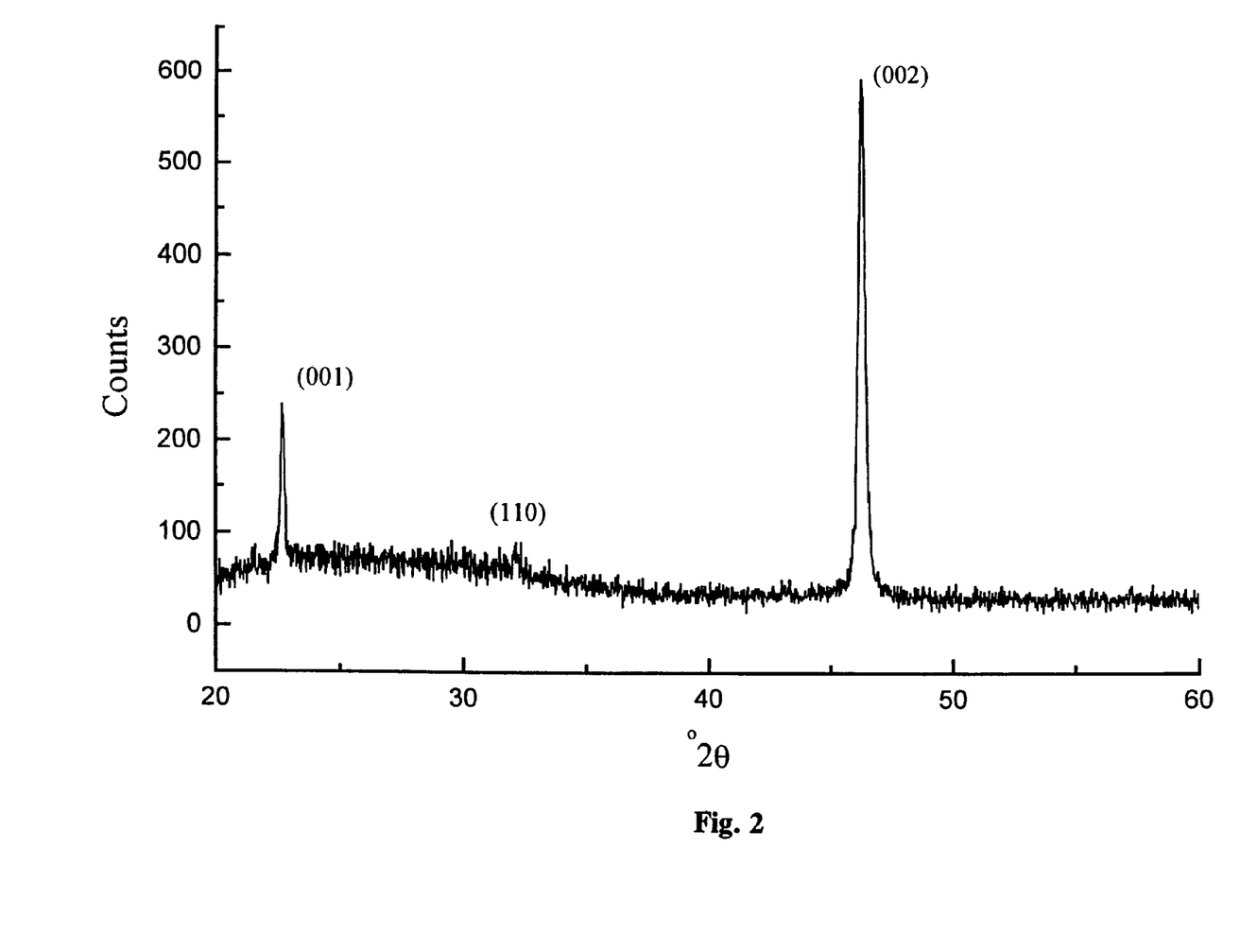
FIG. 2 depicts an X-ray diffraction analysis of the thin film.

When the films were grown at a temperature of 325° C., their composition varied according to the cycle ratio (FIG. 1). The linearity of the curve shown in the figure is an indication that the composition can well be controlled by means of the cycle ratio. Films having Sr/Ti ratios close to 1 were, according to an X-ray diffraction analysis, crystalline $SrTiO_3$ (FIG. 2). TOF-ERDA (Time-of-Flight Elastic Recoil and Detection Analysis) showed that the films contained carbon and hydrogen residues lower than 0.2 at. %, the other possible impurity residues being so low that they cannot be detected by the method concerned.

Figure 3:
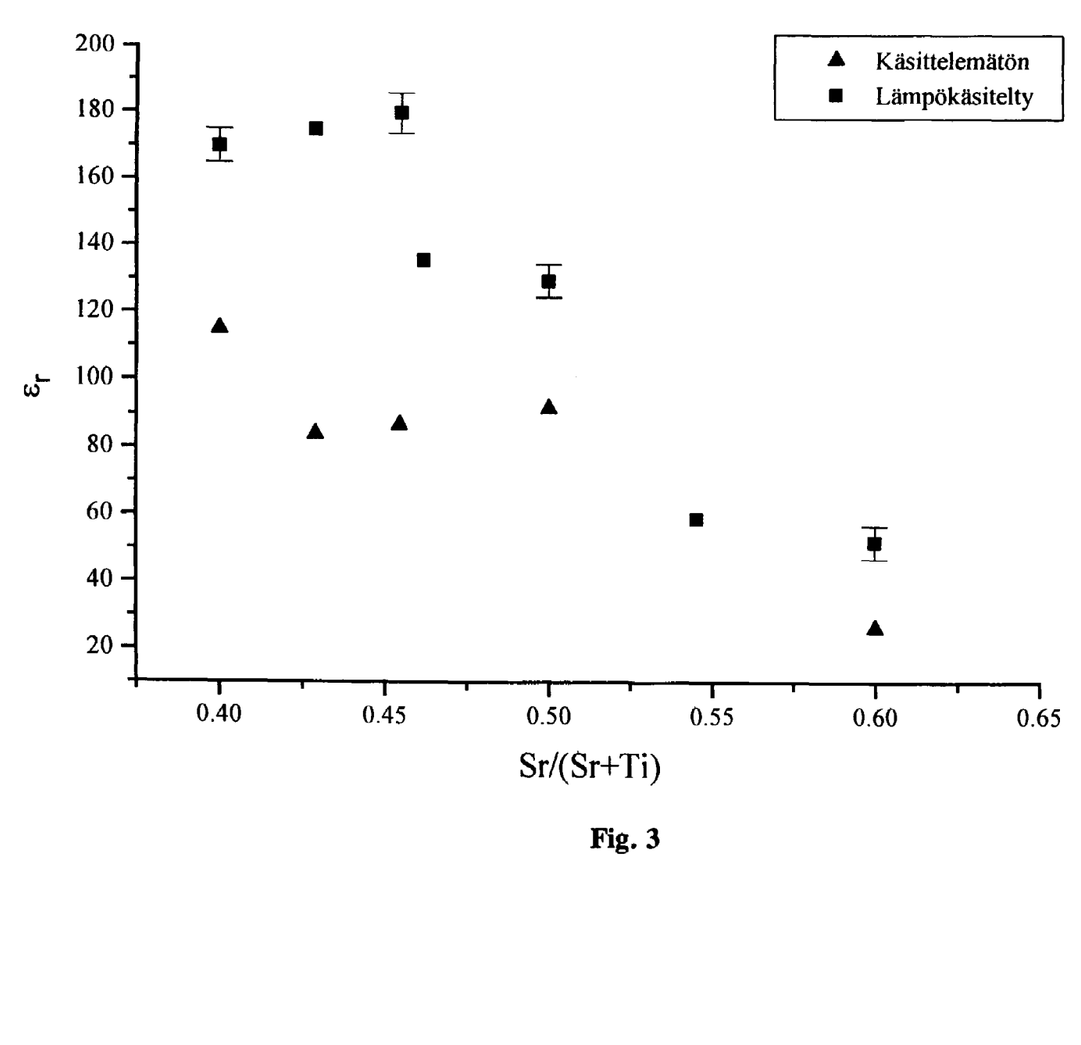
FIG. 3 depicts the permittivities of films deposited at 325° C., as a function of the cycle ratio, as measured from the structure ITO/SrTiO$_3$/Al, where ITO is indium-tin oxide.

FIG. 3 shows the effect of the post-treatment on the permittivity of the film. The permittivities of films without post-treatment are at maximum 118, but annealing in air at a temperature of 500° C. for 60 min increases permittivity significantly, the highest values being 180. The postannealing also increased the intensity of X-ray reflections, showing an improved film crystallinity.

EXAMPLE 2

The process according to Example 1 was repeated using a growth temperature of 250° C. The films thus grown were amorphous, but they crystallized when they were heated in air at 500° C. for 60 min.

EXAMPLE 3

$BaTiO_3$ films were grown in the manner described in Example 1, but by using instead of $Sr(C_5(^iC_3H_7)_3H_2)_2THF_p$ a THF adduct of bis(pentamethylcyclopentadienyl)barium, $Ba(C_5(CH_3)_4)THF_p$, where x=0–2. The deposition temperature was 250° C. When a deposition cycle ratio of (Ti—O)/(Ba—O)=6:5 was used, an amorphous film was obtained. When this film was heated in air at 500° C. for 60 min, it crystallized as $BaTiO_3$, for which a measurement showed a permittivity of 165.

The invention claimed is:

1. A method for growing amorphous oxide thin films on a substrate in a reactor, comprising producing the films by the Atomic Layer Epitaxy (ALE) process at a temperature of 150 to 400° C. by feeding pulses of precursor compounds into the reactor alternately to achieve film growth through saturating surface reactions and by purging the reactor with an inert gas between the precursor pulses to provide alternate self-limiting surface reactions on the substrate, wherein the precursor compounds comprise:
   at least one cyclopentadienyl compound of strontium and/or barium;
   at least one volatile titanium compound; and
   a reactive oxygen precursor.

2. The method according to claim 1, wherein the oxide thin film is dielectric.

3. The method according to claim 1, wherein said method comprises 1–10 growth cycles in succession, wherein one growth cycle comprises:
   feeding of a Ba compound, a Sr compound or a volatile titanium compound;
   an inert purge;
   feeding a reactive oxygen precursor; and
   a second inert purge.

4. The method according to claim 1, wherein the ratio of the at least one cyclopentadienyl compound of strontium and/or barium and the at least one volatile titanium compound is 0.8–1.2.

5. The method according to claim 1, wherein the volatile titanium compound is selected from the group consisting of a titanium halide, a titanium alkoxide, titanium nitrate $(Ti(NO_3)_4)$, an alkylamino complex of titanium, a cyclopentadienyl complex of titanium, a silylamido complex of titanium, titanium dialkyldithiocarbamate, and a titanium-β-diketonate.

6. The method according to claim 1, wherein the substrate is selected from the group consisting of a platinum (Pt), $RuO_2$, $IrO_2$, $SrRuO_3$, $LaSrCoO_3$, $IrO_2/Ir$, $RuO_2/Pt$, silica $(SiO_2)$, silicon nitride and a silicon surface.

7. The method according to claim 1, wherein the reactive oxygen precursor is selected from the group consisting of oxygen $(O_2)$, water vapor, hydrogen peroxide, an aqueous solution of hydrogen peroxide, ozone, and a combination thereof.

8. The method according to claim 1, wherein the at least one cyclopentadienyl compound of strontium and/or barium is $M(Cp)_2$ or $M(Cp)_2L_n$, where
   M is Sr or Ba,
   Cp is a fused or single cyclopentadienyl group of the form $C_5R_mH_{5-m}$, where
   m is an integer 0–5 and
   R is a hydrocarbon group, wherein the m hydrocarbon groups are either the same or different,
   the Cp groups are either the same or different,
   $L_n$ is a neutral adduct ligand which binds to the metal by one or several of the atoms in said neutral adduct ligand.

9. The method according to claim 1, wherein
   the at least one cyclopentadienyl compound of strontium and/or barium is M(Cp)X or $M(Cp)XL_n$, where
   M is Sr or Ba,
   Cp is a fused or single cyclopentadienyl group $C_5R_m H_{5-m}$, where
   m is an integer 0–5 and
   R is a hydrocarbon group, wherein the m R's are either the same or different, X is a ligand having a valence of −1, wherein X is not a cyclopentadienyl group and L is a neutral adduct ligand which binds to the metal by one or several of the atoms making up said neutral adduct ligand.

10. The method according to claim 9, wherein the cyclopentadienyl group is selected from the group consisting of cyclopentadienyl, pentamethylcyclopentadienyl, triisopropylcyclopentadienyl, indenyl, and fluorenyl.

11. The method according to claim 8, wherein the two Cp groups are joined by a bridge.

12. The method according to claim 11, wherein the bridge between the two Cp groups is a substituted or unsubstituted $C_1$–$C_6$ carbon chain.

13. The method according to claim 12, wherein the carbon chain forming the bridge contains a heteroatom selected from the group consisting of silicon, nitrogen, phosphorus, selenium, and sulfur.

14. The method according to claim 9, wherein R is a substituted or unsubstituted, cyclic, linear or branched group selected from the group consisting of an alkyl, an alkenyl, an aryl, an alkylaryl, an arylalkyl, an alkoxy, a thio, an amino, a cyano and a silyl group.

15. The method according to claim 9, wherein the neutral adduct ligand L is selected from the group consisting of:
(i) a hydrocarbon,
(ii) an oxygen-containing hydrocarbon,
(iii) a nitrogen-containing hydrocarbon,
(iv) a sulfur-containing hydrocarbon,
(v) a phosphorus-containing hydrocarbon,
(vi) an arsenic-containing hydrocarbon,
(vii) a selenium-containing hydrocarbon,
(viii) a tellurium-containing hydrocarbon, and a combination thereof.

16. The method according to claim 9, wherein L is selected from the group consisting of:
(a) an amine or polyamine,
(b) a bipyridine,
(c) a ligand depicted by the formula where G is —O—, —S—, or —$NR^1$—, where $R^1$ is hydrogen or a substituted or unsubstituted, cyclic, linear or branched group selected from the group consisting of an alkyl, an alkenyl, an aryl, an alkylaryl, an arylalkyl, an alkoxy, a thio, a cyano and a silyl group, and wherein each carbon atom of the ring according the formula has an $R^1$-like substituent, wherein the substituents are either the same or different,
(d) ether, and
(e) thioether.

17. The method according to claim 9, wherein L is selected from the group consisting of an ether, a polyether, an amine, a polyamine, bipyridine and tetrahydrofuran.

18. The method according to claim 9, wherein X is selected from the group consisting of a β-ketonate, a corresponding sulfur or nitrogen compound, an alkyl, a halide, an amide, an alkoxide, a carboxylate and a Schiff base.

19. The method according to claim 1, wherein the producing of the film takes place at 250–300° C.

20. The method according to claim 3, wherein said method comprises 1–2 growth cycles.

21. The method according to claim 9, wherein the cyclopentadienyl group is selected from the group consisting of cyclopentadienyl, pentamethylcyclopentadienyl, triisopropylcyclopentadienyl, indenyl, and fluorenyl.

22. The method according to claim 9, wherein R is a substituted or unsubstituted, cyclic, linear or branched group selected from the group consisting of an alkyl, an alkenyl, an aryl, an alkylaryl, an arylalkyl, an alkoxy, a thio, an amino, a cyano and a silyl group.

23. The method according to claim 9, wherein the neutral adduct ligand L is selected from the group consisting of:
(i) a hydrocarbon,
(ii) an oxygen-containing hydrocarbon,
(iii) a nitrogen-containing hydrocarbon,
(iv) a sulfur-containing hydrocarbon,
(v) a phosphorus-containing hydrocarbon,
(vi) an arsenic-containing hydrocarbon,
(vii) a selenium-containing hydrocarbon,
(viii) a tellurium-containing hydrocarbon, and a combination thereof.

24. The method according to claim 9, wherein L is selected from the group consisting of:
(a) an amine or polyamine,
(b) a bipyridine,
(c) a ligand depicted by the formula where G is —O—, —S—, or —$NR^1$—, where $R^1$ is hydrogen or a substituted or unsubstituted, cyclic, linear or branched group selected from the group consisting of an alkyl, an alkenyl, an aryl, an alkylaryl, an arylalkyl, an alkoxy, a thio, a cyano and a silyl group, and wherein each carbon atom of the ring according the formula has an $R^1$-like substituent, wherein the substituents are either the same or different,
(d) ether, and
(e) thioether.

25. The method according to claim 19, further comprising postannealing said film at a temperature higher than a temperature at which the producing of the film takes place.

26. The method according to claim 25, wherein post annealing said film takes place at 500° C.

27. A method for growing oxide thin films on a substrate in a reactor, comprising producing amorphous films by the Atomic Layer Epitaxy (ALE) process by feeding alternating pulses of precursor compounds into the reactor alternately to achieve film growth through saturating surface reactions and by purging the reactor with an inert gas between the precursor pulses to provide alternate self-limiting surface reactions on the substrate, wherein the precursor compounds comprise:

at least one cyclopentadienyl compound of strontium and/or barium; and a reactive oxygen precursor.

28. A method for growing oxide thin films on a substrate in a reactor by self-limiting Atomic Layer Epitaxy (ALE), comprising producing the films by feeding pulses of precursor compounds into the reactor to achieve film growth through saturating surface reactions, wherein a growth cycle comprises:

feeding a first reactant pulse into the reactor, wherein the first reactant is selected from the group consisting of a cyclopentadienyl compound of strontium and a cyclopentadienyl compound of barium;

purging the first reactant from the reactor with an inert gas;

pulsing a second reactant pulse into the reactor, the second reactant comprising oxygen;

purging the second reactant from the reactor with an inert gas;

pulsing a third reactant pulse into the reactor, the third reactant comprising a volatile titanium compound; and purging the third reactant from the reactor with an inert gas, wherein the second reactant is pulsed between pulses of the first reactant and the third reactant and the deposition temperature is from 100 to 400° C.

29. The method of claim 28, wherein no more than one molecular layer is deposited onto the substrate per growth cycle.

30. The method of claim 28, wherein the first reactant is a cyclopentadienyl compound of strontium.

31. The method of claim 30, wherein the growth cycle further comprises:

pulsing a fourth reactant pulse into the reactor, the fourth reactant comprising a cyclopentadienyl compound of barium; and purging the fourth reactant from the reactor with an inert gas.

32. The method of claim 30, wherein the growth cycle comprises, in order, pulsing the first reactant, purging the first reactant, pulsing the second reactant, purging the second reactant, pulsing the third reactant and purging the third reactant.

33. The method of claim 30, wherein the growth cycle comprises, in order, pulsing the third reactant, purging the third reactant, pulsing the second reactant, purging the second reactant, pulsing the first reactant, purging the first reactant, pulsing the second reactant and purging the second reactant.

34. The method of claim 28, wherein the first reactant is a cyclopentadienyl compound of barium.

35. The method of claim 34, wherein each cycle further comprises:

pulsing a fourth reactant pulse into the reactor, the fourth reactant comprising a cyclopentadienyl compound of strontium; and removing the fourth reactant from the reactor with an inert gas.

36. A method for growing oxide thin films on a substrate in a reactor by the Atomic Layer Epitaxy (ALE) process at a temperature of 150 to 400° C., the process alternately comprising at least three different growth cycles comprising saturating, self-limiting surface reactions on the substrate, wherein:

a first growth cycle comprises feeding a pulse of a cyclopentadienyl compound of strontium into the reactor;

purging the reactor with an inert gas;

feeding a pulse of a reactive oxygen precursor into the reactor; and purging the reactor with an inert gas; and a second growth cycle comprises feeding a pulse of a volatile titanium compound into the reactor;

purging the reactor with an inert gas;

feeding a pulse of a reactive oxygen precursor into the reactor; and purging the reactor with an inert gas; and a third growth cycle comprises feeding a pulse of a cyclopentadienyl compound of barium into the reactor;

purging the reactor with an inert gas;

feeding a pulse of a reactive oxygen precursor into the reactor; and purging the reactor with an inert gas.

37. The method of claim 36, wherein said method comprises repeating the first growth cycle, the second growth cycle, or the third growth cycle from 1 to 10 times in succession.

38. The method of claim 37, wherein the ratio of the number of first growth cycles to the number of second growth cycles is 0.8–1.2.

39. The method of claim 37, wherein the ratio of the number of third growth cycles to the number of second growth cycles is 0.8–1.2.

* * * * *